(12) United States Patent
Sawamura et al.

(10) Patent No.: US 6,564,458 B1
(45) Date of Patent: May 20, 2003

(54) METHOD FOR MANUFACTURING A RADIATOR

(75) Inventors: Tadashi Sawamura, Tokyo (JP); Takeshi Asao, Chiba (JP)

(73) Assignee: Tokyo First Trading Company (JP)

( * ) Notice: Subject to any disclaimer, the term of this patent is extended or adjusted under 35 U.S.C. 154(b) by 0 days.

(21) Appl. No.: 09/936,083

(22) PCT Filed: Oct. 31, 2000

(86) PCT No.: PCT/JP00/07658

§ 371 (c)(1),
(2), (4) Date: Sep. 6, 2001

(87) PCT Pub. No.: WO01/85377

PCT Pub. Date: Nov. 15, 2001

(30) Foreign Application Priority Data

May 12, 2000 (JP) ......................................... 2000-139551

(51) Int. Cl.[7] ................................................ B23P 15/26
(52) U.S. Cl. .............................. 29/890.054; 29/890.043
(58) Field of Search ........................ 29/890.03, 890.043, 29/890.054; 228/183, 187, 212, 213, 47.1

(56) References Cited

U.S. PATENT DOCUMENTS

| | | | | |
|---|---|---|---|---|
| 3,833,986 A | * | 9/1974 | DeCicco ................ | 29/890.047 |
| 3,920,176 A | * | 11/1975 | Becker et al. ............... | 228/183 |
| 4,076,167 A | * | 2/1978 | Wright ..................... | 228/173.4 |
| 4,326,662 A | * | 4/1982 | Anderson .................... | 228/111 |
| 4,339,066 A | * | 7/1982 | Matthews et al. .......... | 228/183 |
| 5,036,913 A | * | 8/1991 | Murphy et al. ............. | 165/173 |
| 5,380,048 A | * | 1/1995 | Vogel .......................... | 285/22 |
| 6,301,779 B1 | * | 10/2001 | Azar ....................... | 29/890.03 |

FOREIGN PATENT DOCUMENTS

| | | |
|---|---|---|
| JP | 58-90372 | 5/1983 |
| JP | 2127970 | 5/1990 |
| JP | 6216551 | 8/1994 |
| JP | 9277038 | 10/1997 |

* cited by examiner

Primary Examiner—I Cuda Rosenbaum
(74) Attorney, Agent, or Firm—Muserlian, Lucas and Mercanti, LLP

(57) ABSTRACT

A method of manufacturing radiators by joining a corrugated fin to a base plate, characterized by low costs and prevention of thermal deformation of the corrugated fin due to low-temperature soldering. A first soldering at the lower ends of the corrugated fin is conducted by a first soldering alloy in a recess heated by a heating plate in a mobile solder tank filled with the molten first soldering alloy. A second soldering alloy is heated by a heating plate on a base plate and the molten second soldering alloy is used to conduct a second soldering. When the corrugated fin is placed on the base plate, pressed and heated, the first and second solders are melted to join the corrugated fin to the base plate.

20 Claims, 4 Drawing Sheets

(b)

(a)

(b)

(a)

(b)

METHOD FOR MANUFACTURING A RADIATOR

CROSS-REFERENCE TO RELATED APPLICATIONS

This application is a 371 of PCT/JP00/07658 filed Oct. 31, 2000.

BACKGROUND OF THE INVENTION

1. Field of the Invention

The present invention relates to a method for manufacturing a radiator which is used for heat radiation from a CPU or the like in a computer.

2. Description of Related Art

Heretofore, a manufacturing method of a radiator used for heat radiation from a CPU or the like in a computer has been disclosed in, for example, Japanese Patent Publication Laid-open No. 313080/1998.

This conventional example is a manufacturing method of a radiator wherein a corrugate fin made by bending a metallic thin plate of aluminum or the like into a corrugated shape is bonded onto a base plate by soldering.

Furthermore, Japanese Patent Publication Laid-open No. 204968/1999 discloses a method wherein a fin made by extrusion molding is applied onto a base plate by friction soldering or supersonic soldering to form solder plating, and the solder-plated base plate and fin are bonded together by friction soldering.

However, the above-mentioned conventional example of Japanese Patent Publication Laid-open No. 313080/1998 has a problem wherein the bonded corrugate fin is apt to be thermally deformed because it is bonded by soldering in a high temperature state.

Moreover, the above-mentioned conventional example of Japanese Patent Publication Laid-open No. 204968/1999 has a problem wherein the manufacturing cost is high because the base plate has a structure in which an Ag layer is interposed between a Cu material and an Al material, and the final step is a step of bonding the solder-plated base plate and fin together by friction soldering.

Accordingly, it is an object of the present invention to provide a manufacturing method of a radiator wherein a corrugate fin can inexpensively be bonded to a base plate, and the thermal deformation of the corrugate fin can be prevented by soldering at a low temperature.

SUMMARY OF THE INVENTION

The present invention is directed to a manufacturing method of a radiator comprising the steps of:

(1) manually or mechanically fitting a frame onto a corrugate fin made of Al or an Al alloy and bent into a corrugated shape;

(2) manually or mechanically grasping said frame, moving it into a heated recess of a movable solder bath filled with a molten first solder alloy, horizontally moving said movable solder bath while the lower ends of said corrugate fin are dipped in said molten first solder alloy and the lower ends are in a friction state with the bottom surface of said recess, and then applying the first plating of said molten first solder alloy onto the lower ends of said corrugate fin;

(3) heating and melting second solder alloy on a base plate made of one of Cu, a Cu alloy, Al and an Al alloy, rubbing said base plate with a metallic brush which is manually or mechanically moved in a horizontal direction, and then applying the second plating of said molten second solder thereunto; and (4) manually or mechanically grasping said frame, putting said corrugate fin on said base plate, pressing and heating it on said base plate to thereby melt said first plating and said second plating and to bond said corrugate fin onto said base plate, and then removing said frame from said corrugate fin.

Step (2) can be replaced with a step (2a) of manually or mechanically grasping said frame, moving it into a heated recess of a movable solder bath filled with a molten first solder alloy, horizontally moving said frame while the lower ends of said corrugate fin are dipped in said molten first solder alloy and the lower ends are in a friction state with the bottom surface of said recess, and then applying the first plating of said molten first solder alloy onto the lower ends of said corrugate fin.

Step (3) can be replaced with a step (3a) of heating and melting said second solder alloy on a base plate made of one of Cu, a Cu alloy, Al and an Al alloy, bringing a metallic brush into contact therewith, manually or mechanically moving said base plate in a horizontal direction to rub said base plate with said metallic brush, and then applying the second plating of said molten second solder alloy thereunto.

Both steps (2a) and (3a) can be performed in combination.:

Step (2) can also be replaced with a step (2b) of applying a flux to the lower ends of said corrugate fin fitted in said frame, heating it, and then applying the first plating of said first solder alloy onto the lower ends of said corrugate fin.

Step (3) can also be replaced with a step (3b) of applying a flux onto a base plate made of one of Cu, a Cu alloy, Al and an Al alloy, heating it, and then applying the second plating of a second solder alloy onto said base plate.

Both steps (2b) and (3b) can be performed together.

Step (2) can also be replaced with a step (2c) of manually or mechanically grasping said frame, and then, while dipping the lower ends of said corrugate fin in a third solder alloy which is molten, caused to flow, and subjected to ultrasonic vibration, applying the third plating of the molten third solder alloy onto the lower ends of said corrugate fin; and, Step (3) can also be replaced with a step (3c) of, while dipping a base plate made of one of Cu, a Cu alloy, Al and an Al alloy in a fourth solder alloy which is molten, caused to flow, and subjected to ultrasonic vibration, applying the fourth plating of a fourth solder alloy onto said base plate.

In the present invention step (3), (3a), (3b) or (3c) can be a precedent step to or a simultaneous step with said step (1),(2),(2a),(2b) or (2c).

In the present invention the entire body can be plated with one of Al, Ni, Cr, Ag and Au, or an alloy of them, after step (4).

In the present invention only a peripheral portion on said base plate can be covered with a metal mask in said step (3), (3a), (3b) or (3c), and said metal mask can be removed from said base plate in said step (4).

In the present invention said first to fourth solder alloys can be made of Sn and Zn, or Zn and Al.

In the present invention said frame can be made of a metal, a ceramic material or a heat-resistant synthetic resin.

Figure 4:
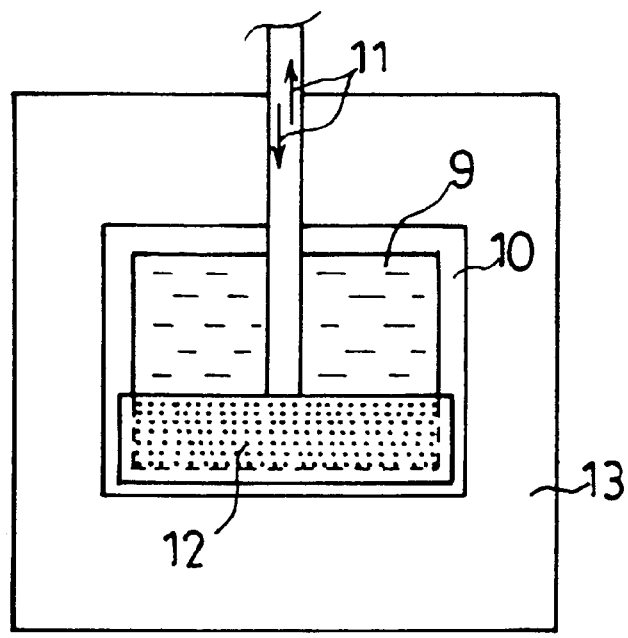
Figure 4:
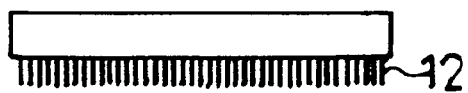
Figure 5:
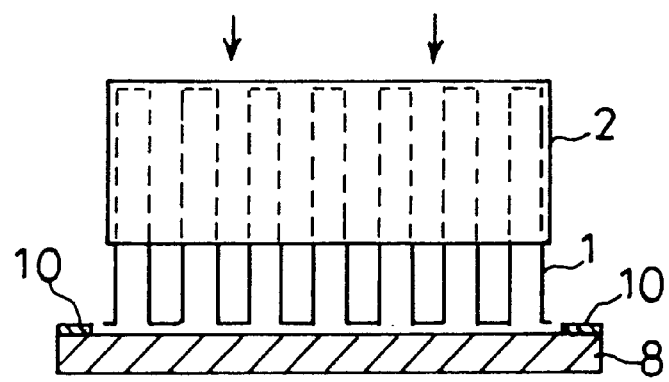

FIS. 3 are illustrative views of a step of the present invention;

FIG. 4 are illustrative views of a step of the present invention;

FIG. 5 is an illustrative view of a step of the present invention; and

Figure 6:
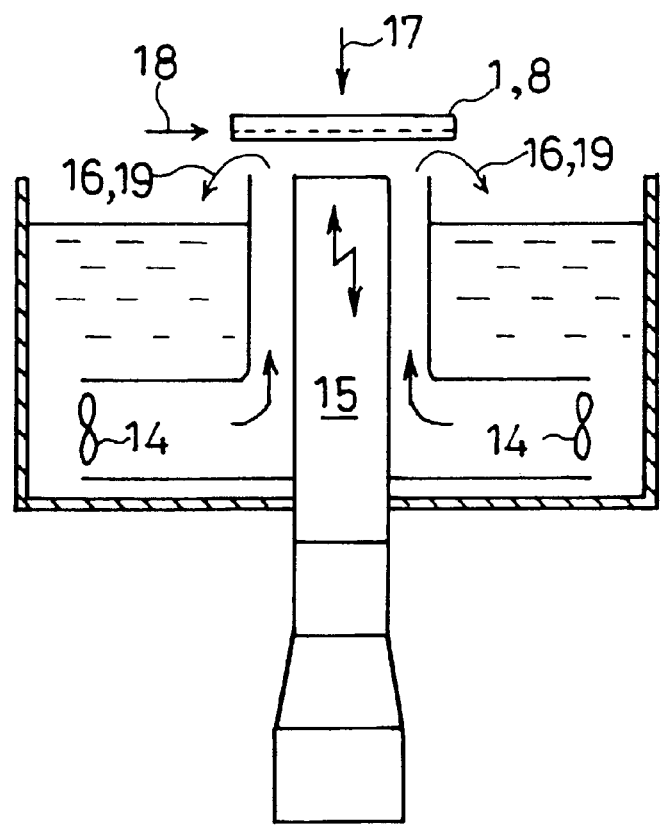

FIG. 6 is an illustrative view of a step according to another embodiment of the present invention.

DETAILED DESCRIPTION OF THE INVENTION

Hereinafter, the present invention will be described on the basis of its embodiments.

Figure 1:
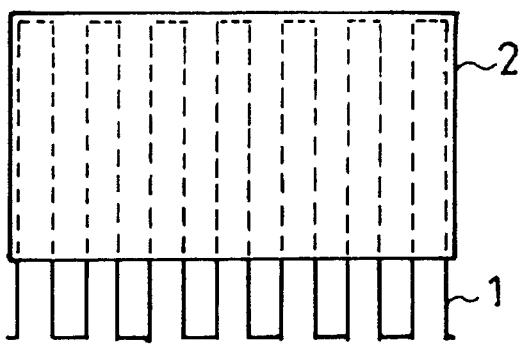
FIG. 1 is an illustrative view of a step of the present invention.

According to the present invention, as shown in FIG. 1, step (1) is shown where a frame 2 is fitted onto a corrugate fin 1 made of Al or an Al alloy and bent into a corrugated shape, not-shown manually or mechanically with a robot or the like.

Figure 2:
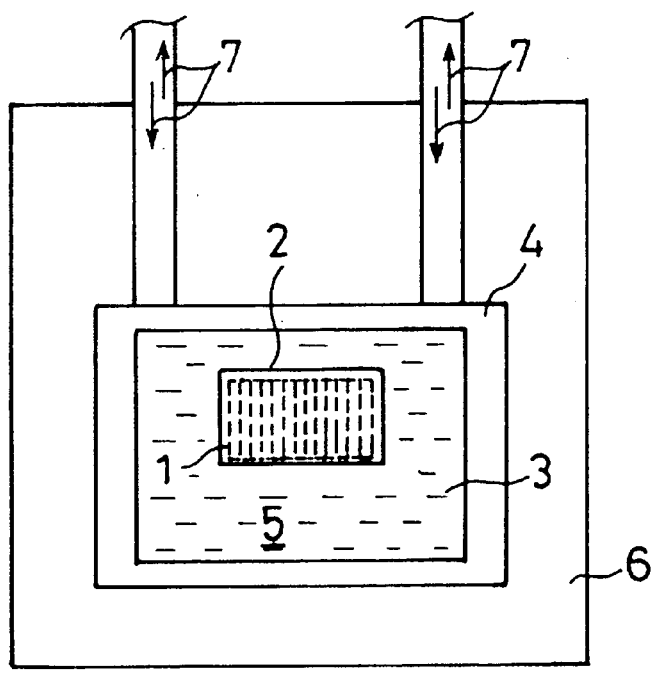
FIG. 2 are illustrative views of a step of the present invention.
Figure 2:
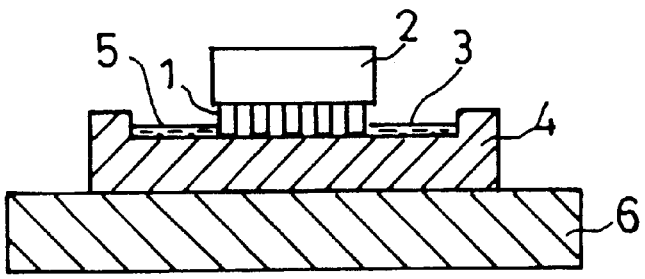

Next, as shown in FIGS. 2(a) and (b), step (2) is shown where the frame 2 is grasped not-shown manually or mechanically with a robot or the like, it is moved into a recess 5 heated with a heating plate 6 of a movable solder bath 4 filled with a molten first solder alloy 3, the movable solder bath 4 is moved horizontally 7 while the lower ends of the corrugate fin 1 are dipped in the molten first solder alloy 3 and the lower ends are in a friction state with a bottom surface of the recess 5, and thereby the first plating of the molten first solder alloy 3 is applied onto the lower ends of the corrugate fin 1.

Figure 3:
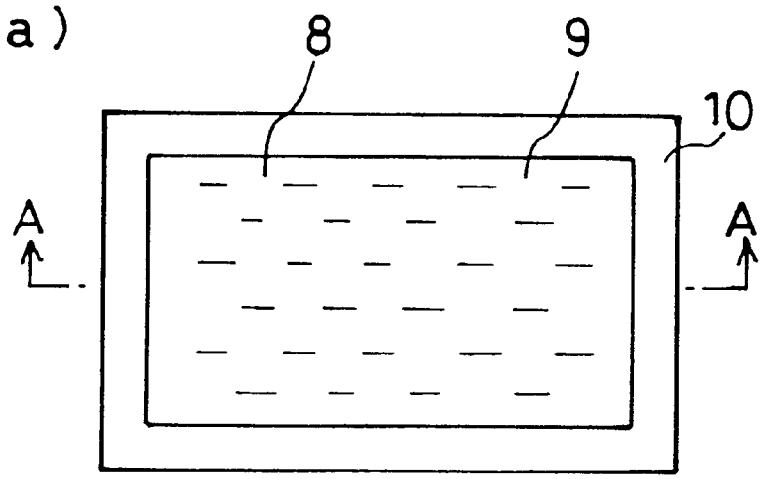
Figure 3:

Next, as shown in FIGS. 3(a) and (b), step (3) is shown where a second solder alloy 9 is heated with a heating plate 13 and molten on a base plate 8 made of one of Cu, a Cu alloy, Al and an Al alloy, and the base plate 8 is rubbed with a metallic brush 12 which is moved by a not shown manual means or mechanically by a robot or the like in a horizontal direction 11 as shown in FIGS. 4(a) and (b), and the second plating of the molten second solder alloy 9 is then applied thereunto. Here, there is also a case that only a peripheral portion on the base plate 8 is covered with a metal mask 10.

Next, as shown in FIG. 5, step (4) is shown where the corrugate fin 1 is put on, pressed onto, and heated on the base plate 8 with grasping the frame 2 not-shown manually or mechanically with a robot or the like, the first plating and the second plating is thereby molten to bond the corrugate fin 8 onto the base plate 8, and then the frame 8 is removed from said corrugate fin. Here, in case of having the metal mask 10, it is also removed.

Therefore, because of not a friction soldering step but a static soldering step in the final step (4), the corrugate fin 1 can inexpensively be bonded to the base plate 2, and the thermal deformation of the corrugate fin 1 can be prevented due to soldering at a low temperature.

According to the present invention step (2) can be replaced with a step (2a) wherein, in FIG. 1, inversely, the frame 2 is grasped not-shown manually or mechanically with a robot or the like; it is moved into a heated recess 5 of a movable solder bath 4 filled with a molten first solder alloy 3; the frame 2 is moved horizontally 7 while the lower ends of the corrugate fin 1 are dipped in said molten first solder alloy 3 and the lower ends are in a friction state with a bottom surface of the recess 5; and the first plating of the molten first solder alloy 3 is applied onto the lower ends of the corrugate fin 1.

Therefore, because of not a friction soldering step but a static soldering step in the final step (4), the corrugate fin 1 can inexpensively be bonded to the base plate 2, and the thermal deformation of the corrugate fin 1 can be prevented due to soldering at a low temperature.

According to the present invention step (3) can be replaced with a step (3a) wherein, in FIG. 1, inversely, a second solder alloy 9 is heated and molten on a base plate 8 made of one of Cu, a Cu alloy, Al and an Al alloy; a metallic brush 12 is brought into contact therewith; the base plate 8 is moved by a not shown manual means or mechanically by a robot or the like in a horizontal direction to rub the base plate 8 with the metallic brush 12; and the second plating of the molten second solder alloy 9 is then applied thereto.

Therefore, because of not a friction soldering step but a static soldering step in the final step (4), the corrugate fin 1 can inexpensively be bonded to the base plate 2, and the thermal deformation of the corrugate fin 1 can be prevented due to soldering at a low temperature.

According to the present invention step (2a) and (3b) can be combined such that step (2) is replaced with a step (2a) wherein the frame 2 is grasped not-shown manually or mechanically with a robot or the like; it is moved into a heated recess 5 of a movable solder bath 4 filled with a molten first solder alloy 3; the frame 2 is moved horizontally 7 while the lower ends of the corrugate fin 1 are dipped in the molten first solder alloy 3 and the lower ends are in a friction state with a bottom surface of the recess 5; and the first plating of the molten first solder alloy 3 is applied onto the lower ends of the corrugate fin 1, and, step (3) is replaced with a step (3a) wherein a second solder alloy 9 is heated and molten on a base plate 8 made of one of Cu, a Cu alloy, Al and an Al alloy; a metallic brush 12 is brought into contact therewith; the base plate 8 is manually or mechanically moved in a horizontal direction to rub the base plate 8 with the metallic brush 12; and the second plating of the molten second solder alloy 9 is then applied thereto.

Therefore, because of not a friction soldering step but a static soldering step in the final step (4), the corrugate fin 1 can inexpensively be bonded to the base plate 2, and the thermal deformation of the corrugate fin 1 can be prevented due to soldering at a low temperature.

According to the present invention step (2) or (2a) can be replaced with a step (2b) wherein, in FIG. 1, a flux is applied to the lower ends of the corrugate fin 1 fitted in the frame 2; it is heated; and the first plating of the first solder alloy 3 is applied onto the lower ends of the corrugate fin 1.

Therefore, because of not a friction soldering step but a static soldering step in the step (2b), (4), the corrugate fin 1 can inexpensively be bonded to the base plate 2, and the thermal deformation of the corrugate fin 1 can be prevented due to soldering at a low temperature.

According to the present invention step (3) or (3a) can be replaced with a step (3b) wherein, in FIG. 1, a flux is applied onto a base plate 2 made of one of Cu, a Cu alloy, Al and an Al alloy; it is heated; and the second plating of a second solder alloy 9 is applied onto the base plate 2.

Therefore, because of not a friction soldering step but a static soldering step in the step (3b), (4), the corrugate fin 1 can inexpensively be bonded to the base plate 2, and the thermal deformation of the corrugate fin 1 can be prevented due to soldering at a low temperature.

According to the present invention steps (2b) and (3b) can be combined such that, in FIG. 1, a flux is applied to the lower ends of the corrugate fin 1 fitted in the frame 2; it is heated; and thereby the first plating of the first solder alloy 3 is applied onto the lower ends of the corrugate fin 1, and, a flux is applied onto a base plate 8 made of one of Cu, a Cu alloy, Al and an Al alloy; it is heated; and thereby the second plating of a second solder alloy 9 onto the base plate 8.

Therefore, because of not a friction soldering step but a static soldering step in the step (2b), (3b), (4), the corrugate fin 1 can inexpensively be bonded to the base plate 2, and the thermal deformation of the corrugate fin 1 can be prevented due to soldering at a low temperature.

According to the present invention step (2) can be replaced with a step (2c) wherein, as shown in FIG. 6, the frame 2 is grasped not-shown manually or mechanically with a robot or the like; while the lower ends of the corrugate fin 1 typically shown are moved vertically 17 or horizontally 18 and are dipped in a third solder alloy 16 which is molten, caused to flow by a fan 14, and subjected to ultrasonic vibration by a supersonic oscillator 15, the third plating of the molten third solder alloy 16 is applied onto the lower ends of the corrugate fin 1.

Further, step (3) can be replaced with a step (3c) wherein, as shown in FIG. 6, while a base plate 8 made of one of Cu, a Cu alloy, Al and an Al alloy is moved vertically 17 or horizontally 18 with being vertically inverted and dipped in a fourth solder alloy 19 which is molten, caused to flow by a fan 14, and subjected to ultrasonic vibration by a supersonic oscillator 15; and the fourth plating of the fourth solder alloy 19 is applied onto the base plate 8.

Therefore, because of not a friction soldering step but a static soldering step in the final step (4), the corrugate fin 1 can inexpensively be bonded to the base plate 2, and the thermal deformation of the corrugate fin 1 can be prevented due to soldering at a low temperature.

According to the present invention, step (3), (3a), (3b), or (3c) is a precedent step to or a simultaneous step with said step (1),(2),(2a),(2b) or (2c).

Therefore, various manufacturing steps can be selected. This is convenient.

According to the present invention, because the entire body is plated with one of Al, Ni, Cr, Ag, and Au, or an alloy of them after said step (4), a radiator superior in anti-corrosion can be manufactured.

According to the present invention, only a peripheral portion on the base plate 8 is covered with a metal mask in said step (3), (3a), (3b), or (3c), and said metal mask 10 is removed from the base plate 8 in said step (4).

Therefore, because of the metal mask 10, the peripheral portion on the base plate 8 is not plated. This portion can be used for various applications.

According to the present invention, because said first to fourth solder alloys are made of Sn, Zn, or Zn, Al, the wettability of the solder bonding portion becomes good. But, the present invention is not limited to these materials.

According to the present invention, the frame 2 is made of a metal such as an Fe alloy, a ceramic material or a heat-resistant synthetic resin such as a polyimide, and therefore, this frame 2 is strong and not deformed by heat.

As shown in FIG. 1, step (1) is shown where a frame 2 is fitted onto a corrugate fin 1 made of Al or an Al alloy and bent into a corrugated shape, not-shown manually or mechanically with a robot or the like. In the interior of the frame 2, not shown partitions may properly be provided so as to fit with the corrugate fin 1 bent into the corrugated shape.

Next, as shown in FIGS. 2(a) and (b), step (2) is shown where the frame 2 is grasped not-shown manually or mechanically with a robot or the like and moved into a recess 5 heated with a heating plate 6 of a movable solder bath 4 filled with a molten first solder alloy 3, the movable solder bath 4 is moved horizontally 7 while the lower ends of the corrugate fin 1 are dipped in the molten first solder alloy 3 and the lower ends are in a friction state with a bottom surface of the recess 5, and thereby the first plating of the molten first solder alloy 3 is applied onto the lower ends of the corrugate fin 1.

Next, as shown in FIGS. 3(a) and (b), step (3) is shown where a second solder alloy 9 is heated with a heating plate 13 and molten on a base plate 8 made of one of Cu, a Cu alloy, Al and an Al alloy, a metallic brush 12 not-shown manually or mechanically moving horizontally 11 with a robot or the like as shown in FIGS. 4(a) and (b) is slid in friction on the base plate 8, and thereby the second plating of the molten second solder alloy 9 is applied. Here, there is also a case that only a peripheral portion on the base plate 8 is covered with a metal mask 10.

Next, as shown in FIG. 5, step (4) is shown where the corrugate fin 1 is put on, pressed onto, and heated on the base plate 8 with grasping the frame 2 not-shown manually or mechanically with a robot or the like, the first plating and the second plating is thereby molten to bond the corrugate fin 1 onto the base plate 8, and then the frame 2 is removed from said corrugate fin. Here, in case of having the metal mask 10, it is also removed.

Next, in a manufacturing method of a radiator according to another embodiment of the present invention, the above step (2) is replaced with a step (2a) wherein, in FIG. 1, inversely, the frame 2 is grasped not-shown manually or mechanically with a robot or the like; it is moved into a heated recess 5 of a movable solder bath 4 filled with a molten first solder alloy 3; the frame 2 is moved horizontally 7 while the lower ends of the corrugate fin 1 are dipped in said molten first solder alloy 3 and the lower ends are in a friction state with a bottom surface of the recess 5; and thereby the first plating of the molten first solder alloy 3 is applied onto the lower ends of the corrugate fin 1.

Next, in a manufacturing method of a radiator according to another embodiment of the present invention, the above step (3) is replaced with a step (3a) wherein, in FIG. 1, inversely, a second solder alloy 9 is heated and molten on a base plate 8 made of one of Cu, a Cu alloy, Al and an Al alloy; a metallic brush 12 is brought into contact; the base plate 8 is moved by a not shown manual means or mechanically by a robot or the like in a horizontal direction to rub the base plate 8 with the metallic brush 12; and the second plating of the molten second solder alloy 9 is applied.

Next, in a manufacturing method of a radiator according to another embodiment of the present invention, the above step (2) is replaced with a step (2a) wherein the frame 2 is grasped not-shown manually or mechanically with a robot or the like; it is moved into a heated recess 5 of a movable solder bath 4 filled with a molten first solder alloy 3; the frame 2 is moved horizontally 7 while the lower ends of the corrugate fin 1 are dipped in the molten first solder alloy 3 and the lower ends are in a friction state with a bottom surface of the recess 5; and the first plating of the molten first solder alloy 3 is applied onto the lower ends of the corrugate fin 1.

Furthermore, the above step (3) is replaced with a step (3a) wherein a second solder alloy 9 is heated and molten on a base plate 8 made of one of Cu, a Cu alloy, Al and an Al alloy; a metallic brush 12 is brought into contact therewith;

the base plate 8 is manually or mechanically moved in a horizontal direction to rub the base plate 8 with the metallic brush 12; and the second plating of the molten second solder alloy 9 is applied thereto.

Next, in a manufacturing method of a radiator according to another embodiment of the present invention, the above step (2) or (2a) is replaced with a step (2b) wherein, in FIG. 1, a flux is applied to the lower ends of the corrugate fin 1 fitted in the frame 2; it is heated; and the first plating of the first solder alloy 3 is applied onto the lower ends of the corrugate fin 1.

Next, in a manufacturing method of a radiator according to another embodiment of the present invention, the above step (3) or (3a) is replaced with a step (3b) wherein, in FIG. 1, a flux is applied onto a base plate 8 made of one of Cu, a Cu alloy, Al and an Al alloy; it is heated; and the second plating of a second solder alloy 9 is applied onto the base plate 8.

Next, in a manufacturing method of a radiator according to another embodiment of the present invention, the above step (2) or (2a) is replaced a step (2b) wherein, in FIG. 1, a flux is applied to the lower ends of the corrugate fin 1 fitted in the frame 2; it is heated; and thereby the first plating of the first solder alloy 3 is applied onto the lower ends of the corrugate fin 1, and, the above step (3) or (3a) is replaced with a step (3b) wherein, a flux is applied onto a base plate 8 made of one of Cu, a Cu alloy, Al and an Al alloy; it is heated; and the second plating of a second solder alloy 9 is applied onto the base plate 8.

Next, in a manufacturing method of a radiator according to another embodiment of the present invention, the above step (2) is replaced with a step (2c) wherein, as shown in FIG. 6, the frame 2 is grasped not-shown manually or mechanically with a robot or the like; while the lower ends of the corrugate fin 1 typically shown are moved vertically 17 or horizontally 18 and are dipped in a third solder alloy 16 which is molten, caused to flow by a fan 14, and subjected to ultrasonic vibration by a supersonic oscillator 15; the third plating of the molten third solder alloy 16 is applied onto the lower ends of the corrugate fin 1.

Further, the above step (3) is replaced with a step (3c) wherein, as shown in FIG. 6, while a base plate 8 made of one of Cu, a Cu alloy, Al and an Al alloy is moved vertically 17 or horizontally 18 with being vertically inverted and dipped in a fourth solder alloy 19 which is molten, caused to flow by a fan 14, and subjected to ultrasonic vibration by a supersonic oscillator 15; and the fourth plating of the fourth solder alloy 19 is applied onto the base plate 8.

Next, in a manufacturing method of a radiator according to another embodiment of the present invention, said step (3), (3a), (3b), or (3c) is a precedent step to or a simultaneous step with said step (1),(2),(2a),(2b) or (2c).

Here, in the above present invention, the entire body is plated with one of Al, Ni, Cr, Ag, and Au, or an alloy of them after said step (4).

Further, in the above present invention, only a peripheral portion on the base plate 8 is covered with a metal mask in said step (3), (3a), (3b), or (3c), and said metal mask 10 is removed from the base plate 8 in said step (4).

Further, in the above present invention, the first to fourth solder alloys are made of Sn, Zn, or Zn, Al. But, the present invention is not limited to these materials.

Furthermore, in the above present invention, the frame is made of metal such as an Fe alloy, ceramic, or a heat-resistant synthetic resin such as a polyimide.

What is claimed is:

1. A manufacturing method of a radiator comprising the steps of:

(1) manually or mechanically fitting a frame onto a corrugate fin made of Al or an Al alloy and bent into a corrugated shape;

(2) a first plating accomplished by a step of manually or mechanically grasping said frame, moving it into a heated recess of a movable solder bath filled with a molten first solder alloy, horizontally moving said movable solder bath while the lower ends of said corrugate fin are dipped in said molten first solder alloy and the lower ends are in a friction state with the bottom surface of said recess, and then applying the first plating of said molten first solder alloy onto the lower ends of said corrugate fin;

(3) a second plating accomplished by a step of heating and melting second solder alloy on a base plate made of one of Cu, a Cu alloy, Al and an Al alloy, rubbing said base plate with a metallic brush which is manually or mechanically moved in a horizontal direction, and then applying the second plating of said molten second solder thereunto; and (4) manually or mechanically grasping said frame, putting said corrugate fin on said base plate, pressing and heating it on said base plate to thereby melt said first plating and said second plating and to bond said corrugate fin onto said base plate, and then removing said frame from said corrugate fin.

2. The manufacturing method of the radiator according to claim 1, wherein:

said first plating is accomplished by a step (2a) of manually or mechanically grasping said frame, moving it into a heated recess of a movable solder bath filled with a molten first solder alloy, horizontally moving said frame while the lower ends of said corrugate fin are dipped in said molten first solder alloy and the lower ends are in a friction state with the bottom surface of said recess, and then applying the first plating of said molten first solder alloy onto the lower ends of said corrugate fin.

3. The manufacturing method of the radiator according to claim 1, wherein:

said second plating is accomplished by a step (3a) of heating and melting said second solder alloy on a base plate made of one of Cu, a Cu alloy, Al and an Al alloy, bringing a metallic brush into contact therewith, manually or mechanically moving said base plate in a horizontal direction to rub said base plate with said metallic brush, and then applying the second plating of said molten second solder alloy thereunto.

4. The manufacturing method of the radiator according to claim 1, wherein:

said first plating is accomplished by a step (2a) of manually or mechanically grasping said frame, moving it into a heated recess of a movable solder bath filled with a molten first solder alloy, horizontally moving said frame while the lower ends of said corrugate fin are dipped in said molten first solder alloy and the lower ends are in a friction state with the bottom surface of said recess, and then applying the first plating of said molten first solder alloy onto the lower ends of said corrugate fin; and, said second plating is accomplished by a step (3a) of heating and melting said second solder alloy on a base plate made of one of Cu, a Cu alloy, Al and an Al alloy, bringing a metallic brush into contact therewith, manually or mechanically moving said base plate in a horizontal direction to rub said base plate with said metallic brush, and then applying the second plating of said molten second solder alloy thereunto.

5. The manufacturing method of a radiator according to claim 1 wherein:
   said first plating is accomplished by
      a step (2b) of applying a flux to the lower ends of said corrugate fin fitted in said frame, heating it, and then applying the first plating of said first solder alloy onto the lower ends of said corrugate fin.

6. The manufacturing method of a radiator according to claim 1 wherein:
   said second plating is accomplished by
      a step (3b) of applying a flux onto a base plate made of one member of the group consisting of Cu, a Cu alloy, Al and an Al alloy, heating it, and then applying the second plating of a second solder alloy onto said base plate.

7. The manufacturing method of the radiator according to claim 1, wherein:
   said first plating is accomplished by
      a step (2b) of applying a flux to the lower ends of said corrugate fin fitted in said frame, heating it, and then applying the first plating of said first solder alloy onto the lower ends of said corrugate fin; and,
   said second plating is accomplished by
      a step (3b) of applying a flux onto a base plate made of one member of the group consisting of Cu, a Cu alloy, Al and an Al alloy, heating it, and then applying the second plating of a second solder alloy onto said base plate.

8. The manufacturing method of the radiator according to claim 1, wherein:
   said first plating is accomplished by
      a step (2c) of manually or mechanically grasping said frame, and then, while dipping the lower ends of said corrugate fin in a third solder alloy which is molten, caused to flow, and subjected to ultrasonic vibration, applying the third plating of the molten third solder alloy onto the lower ends of said corrugate fin; and,
   said second plating is accomplished by
      a step (3c) of, while dipping a base plate made of one member of the group consisting of Cu, a Cu alloy, Al and an Al alloy in a fourth solder alloy which is molten, caused to flow, and subjected to ultrasonic vibration, applying the fourth plating of a fourth solder alloy onto said base plate.

9. The manufacturing method of the radiator according to claim 1, wherein:
   said step (3) is a precedent step to or a simultaneous step with said step (1) or (2).

10. The manufacturing method of the radiator according to claim 1, wherein the entire body is plated with one member of the group consisting of Al, Ni, Cr, Ag and Au, or an alloy of the said metals, after said step (4).

11. The manufacturing method of the radiator according to claim 1, wherein only a peripheral portion on said base plate is covered with a metal mask in said step (3) and said metal mask is removed from said base plate in said step (4).

12. The manufacturing method of the radiator according to claim 1, wherein said first to fourth solder alloys are made of Sn and Zn, or Zn and Al.

13. The manufacturing method of the radiator according to claim 1, wherein said frame is made of material selected from the group consisting of a metal, a ceramic material and a heat-resistant synthetic resin.

14. The manufacturing method of the radiator according to claim 2 wherein said step (3) is precedent to or a simultaneous step with said step (1) or step (2a).

15. The manufacturing method of the radiator according to claim 3 wherein said step (3a) is precedent to or a simultaneous step with said step (1) or step (2).

16. The manufacturing method of the radiator according to claim 4 wherein said step (3a) is precedent to or a simultaneous step with said step (1) or step (2a).

17. The manufacturing method of the radiator according to claim 5 wherein said step (3) is precedent to or a simultaneous step with said step (1) or step (2b).

18. The manufacturing method of the radiator according to claim 6 wherein said step (3b) is precedent to or a simultaneous step with said step (1) or step (2).

19. The manufacturing method of the radiator according to claim 7 wherein said step (3b) is precedent to or a simultaneous step with said step (1) or step (2b).

20. The manufacturing method of the radiator according to claim 8 wherein said step (3c) is precedent to or a simultaneous step with said step (1) or step (2c).

* * * * *